(12) United States Patent
Tanaka (10) Patent No.: US 7,738,114 B2
(45) Date of Patent: Jun. 15, 2010

(54) EXPOSURE APPARATUS CONFIGURED TO MINIMIZE EFFECTS OF MECHANISM FOR MEASURING STAGE POSITION ON PERIPHERAL MECHANISM AND DEVICE-MANUFACTURING METHOD

(75) Inventor: Hideo Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 208 days.

(21) Appl. No.: 11/951,126

(22) Filed: Dec. 5, 2007

(65) Prior Publication Data

US 2008/0137096 A1    Jun. 12, 2008

(30) Foreign Application Priority Data

Dec. 8, 2006    (JP) .............................. 2006-332688

(51) Int. Cl.
*G01B 9/02*    (2006.01)
(52) U.S. Cl. ...................................... 356/500
(58) Field of Classification Search .................. 356/500
See application file for complete search history.

(56) References Cited

U.S. PATENT DOCUMENTS 6,819,433 B2    11/2004    Takai
6,867,849 B2    3/2005    Iwamoto

FOREIGN PATENT DOCUMENTS

JP    2001-345254    12/2001

*Primary Examiner*—Hwa S. A Lee
(74) *Attorney, Agent, or Firm*—Canon USA Inc IP Div (57) ABSTRACT

An exposure apparatus includes a stage configured to hold an original thereon and to move in a horizontal direction, a first interferometer configured to emit first measurement light used for measuring a position of the stage in a vertical direction thereof, a first mirror provided on a bottom surface of the stage, and a second mirror provided directly below the first mirror. The second mirror is disposed so as to guide the first measurement light emitted from the first interferometer to the first mirror.

3 Claims, 6 Drawing Sheets

EXPOSURE APPARATUS CONFIGURED TO MINIMIZE EFFECTS OF MECHANISM FOR MEASURING STAGE POSITION ON PERIPHERAL MECHANISM AND DEVICE-MANUFACTURING METHOD

BACKGROUND OF THE INVENTION

1. Field of the Invention

The present invention relates to exposure apparatuses used in manufacturing processes of devices, such as semiconductor and liquid crystal devices, and having high controllability of stages, and to device-manufacturing methods performed using such exposure apparatuses.

2. Description of the Related Art

In related art, when devices such as semiconductor or liquid crystal devices are to be manufactured, a projection-type exposure apparatus is used. Specifically, in such an exposure apparatus of a projection type, a pattern drawn on a reticle by photolithography is de-magnified and projected by a projection optical system, and the pattern is then transferred onto a wafer.

In order to perform an exposure process with high precision, the reticle is held by a reticle stage and moves together with the reticle stage.

If the exposure apparatus is of a scanning type, the reticle stage needs to move by a long stroke along one of its axes. There have been proposed technologies in which an interferometer is used to enhance the mobility of the reticle stage that moves by a long stroke along the one axis.

One example of such a technology is proposed in Japanese Patent Laid-Open No. 2001-345254, which discloses a compact stage device that has a laser interferometer for achieving high-precision measurement and that can move with high precision.

Figure 7A:
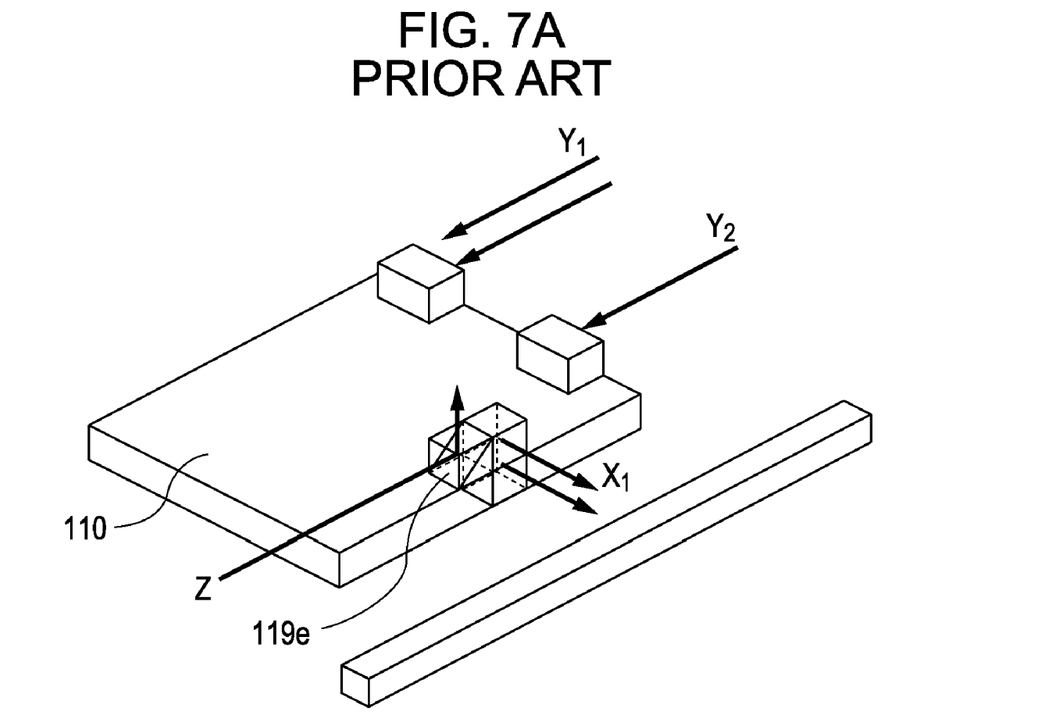
FIG. 7A illustrates a part of a reticle stage of related art.
Figure 7B:
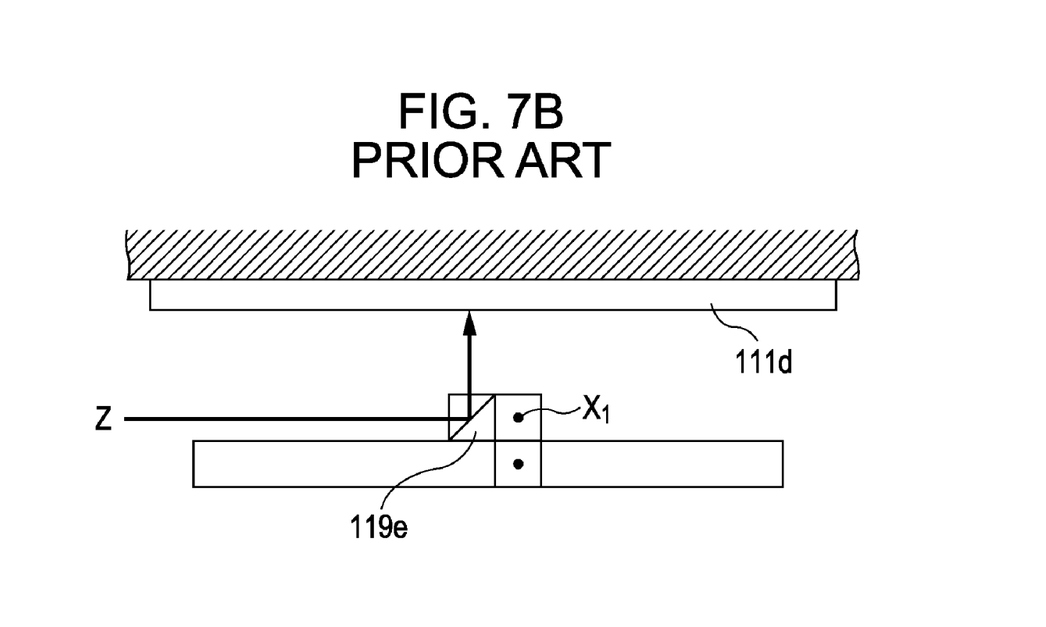
FIG. 7B illustrates an upper part of the reticle stage of the related art.

A reticle stage described in Japanese Patent Laid-Open No. 2001-345254 will be described below with reference to FIGS. 7A and 7B. In detail, the position of a reticle stage 110 in a Y-axis direction is measured on the basis of measurement light Y1 or Y2 from a laser interferometer. The position of the reticle stage 110 in an X-axis direction is measured on the basis of measurement light X1. The position of the reticle stage 110 in a Z-axis direction is measured on the basis of measurement light Z. For the position measurement in the Z-axis direction, a mirror 119e is provided on the reticle stage 110, and a mirror 111d is provided above the reticle stage 110. The measurement light from the laser interferometer is reflected orthogonally upward by the mirror 119e and is subsequently reflected by the mirror 111d provided above the reticle stage 110. The measurement light is reflected again by the mirror 119e so as to be guided to the laser interferometer.

Providing the mirrors 119e and 111d allows for high-precision measurement of the position of the reticle stage 110 in the Z-axis direction.

In order to measure the position of the reticle stage 110 in the Z-axis direction in the related art described above, the mirror 111d above the reticle stage 110 needs to extend over the stroke range. In this case, a supporting structure for supporting the mirror 111d is necessary. However, since an optical system for guiding exposure light to the reticle is disposed above the reticle stage 110, there is not enough space for such a structure.

Furthermore, because the position of the reticle stage 110 is determined on the basis of a projection optical system, it is desirable that the mirror 111d be supported by a supporting structure that supports the projection optical system.

However, there are serious design limitations in providing such a supporting structure that supports the projection optical system above the reticle stage 110. In other words, it is desirable that a projection optical system be similarly disposed below the reticle stage 110 and that the space between the reticle and the projection optical system be reduced to enhance the optical performance of the exposure apparatus. However, if the laser interferometer is disposed directly below the reticle stage 110, there is not enough space for the projection optical system and the like.

SUMMARY OF THE INVENTION

The present invention provides a lightweight exposure apparatus having high controllability, in which a mechanism that measures the position of a reticle stage in a Z-axis direction has less effect on peripheral mechanisms.

An exposure apparatus according to an aspect of the invention includes a stage configured to hold an original thereon and to move in a horizontal direction; a first interferometer configured to emit first measurement light used for measuring a position of the stage in a vertical direction thereof; a first mirror provided on a bottom surface of the stage; and a second mirror provided directly below the first mirror. The second mirror is disposed so as to guide the first measurement light emitted from the first interferometer to the first mirror.

Further features of the present invention will become apparent from the following description of exemplary embodiments with reference to the attached drawings.

DESCRIPTION OF THE EMBODIMENTS

Exemplary embodiments of the present invention will be described below with reference to the drawings.

First Embodiment

Figure 1:
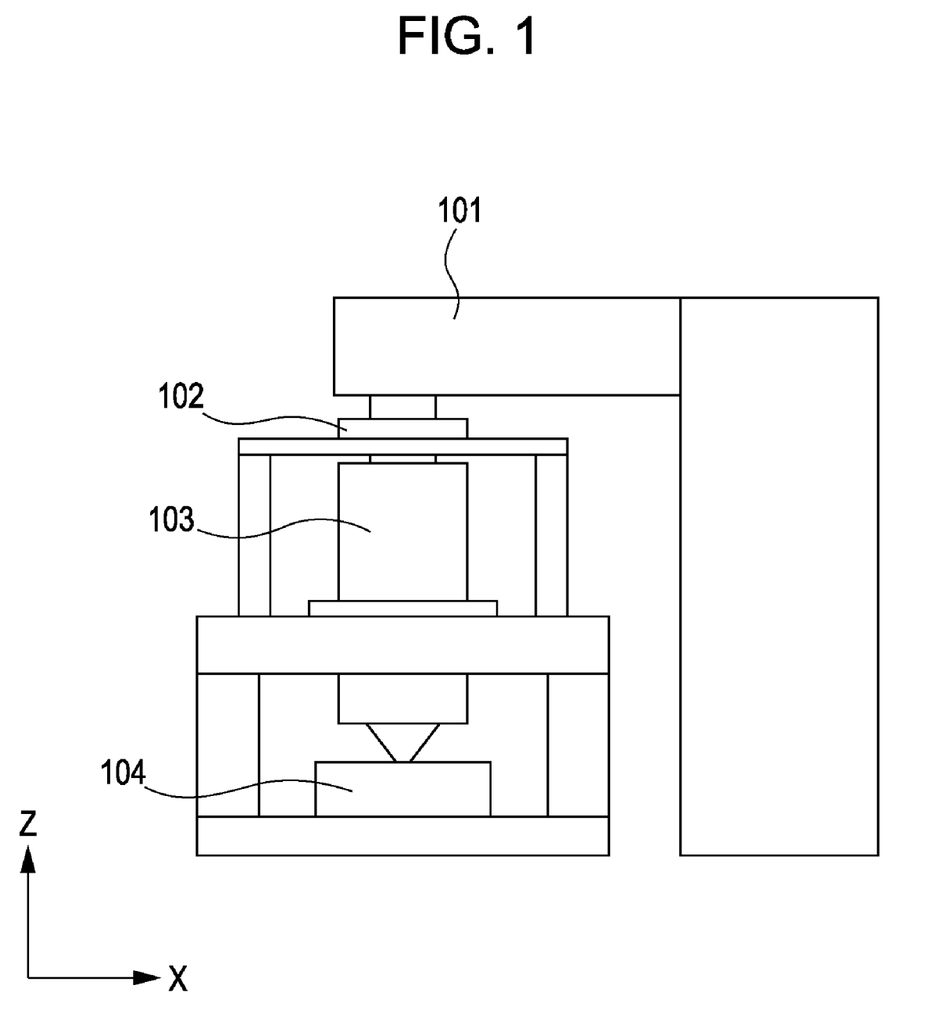
FIG. 1 schematically illustrates an exposure apparatus according to a first embodiment of the present invention.

FIG. 1 schematically illustrates an exposure apparatus according to a first embodiment of the invention.

As shown in FIG. 1, the exposure apparatus includes an illumination device 101, a reticle stage 102 on which a reticle is placed, a projection optical system 103, and a wafer stage 104 on which a wafer is placed.

The exposure apparatus projects a circuit pattern formed on the reticle onto the wafer by exposure using a step-and-repeat exposure method or a step-and-scan exposure method.

The illumination device 101 illuminates the reticle having the circuit pattern and includes a light source unit and an illumination optical system. The light source unit includes, for example, a laser as a light source.

The laser may be, for example, an ArF excimer laser with a wavelength of about 193 nm, a KrF excimer laser with a wavelength of about 248 nm, or an F2 excimer laser with a wavelength of about 153 nm.

However, the laser is not limited to excimer lasers, and may alternatively be, for example, a YGA laser. The number of lasers is also not limited.

When a laser is used as a light source, a beam-shaping optical system for shaping a parallel light beam from the laser light source into a desired beam form and an incoherent optical system for converting a coherent laser beam into an incoherent laser beam can be used.

The light source that can be used in the light source unit is not limited to lasers, and may alternatively be lamps, such as one or more mercury lamps or xenon lamps.

The illumination optical system is an optical system for illuminating a mask, and includes a lens, a mirror, a light integrator, and an aperture.

The projection optical system 103 can be, for example, an optical system including only a plurality of lens elements or an optical system (catadioptric optical system) including a plurality of lens elements and at least one concave mirror.

As further alternatives, the projection optical system 103 can be an optical system including a plurality of lens elements and at least one diffractive optical element, such as a kinoform, or an optical system including only a plurality of mirrors.

The reticle stage 102 and the wafer stage 104 are movable by means of, for example, linear motors. In the case of a step-and-scan exposure method, the stages 102 and 104 are moved in synchronization with each other.

At least one of the wafer stage 104 and the reticle stage 102 is provided with an additional actuator for positioning the reticle pattern with respect to the wafer.

The above-described exposure apparatus can be used for manufacturing a semiconductor device such as a semiconductor integrated circuit, a micro-machine, or a device such as a thin film magnetic head that has a micro-pattern.

Figure 2A:
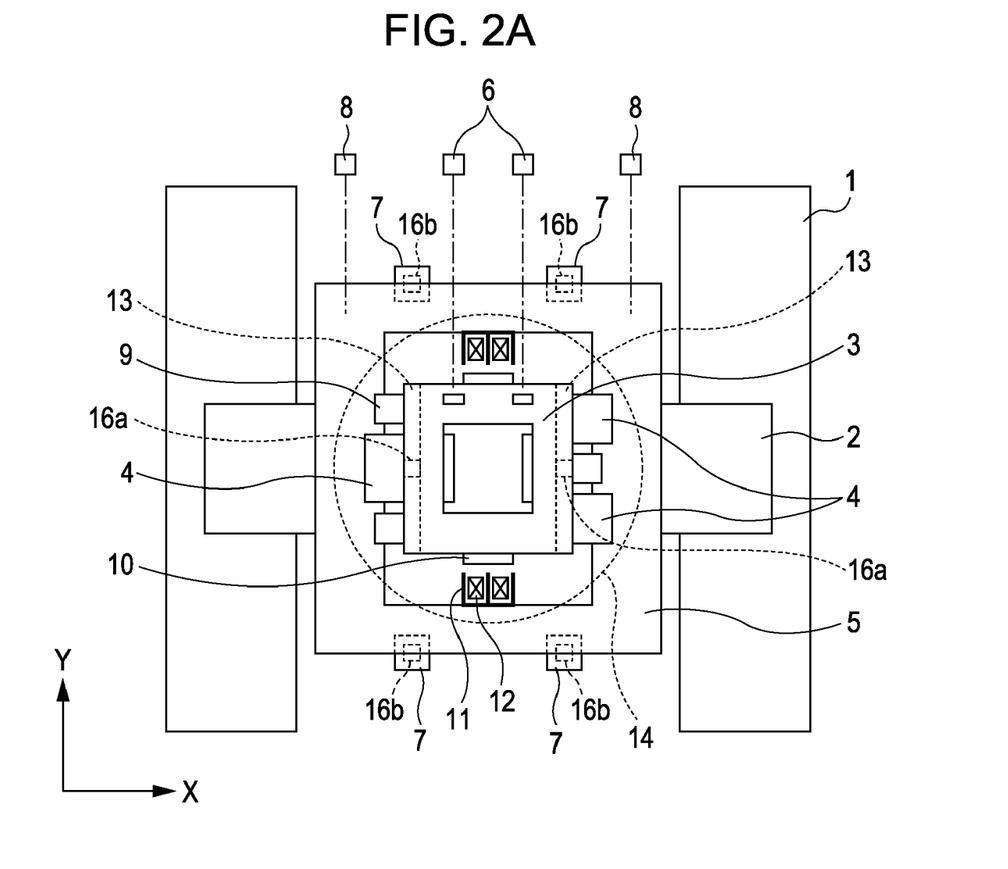
FIG. 2A is a top view of a reticle stage that includes elements according to the first embodiment of the invention.
Figure 2B:
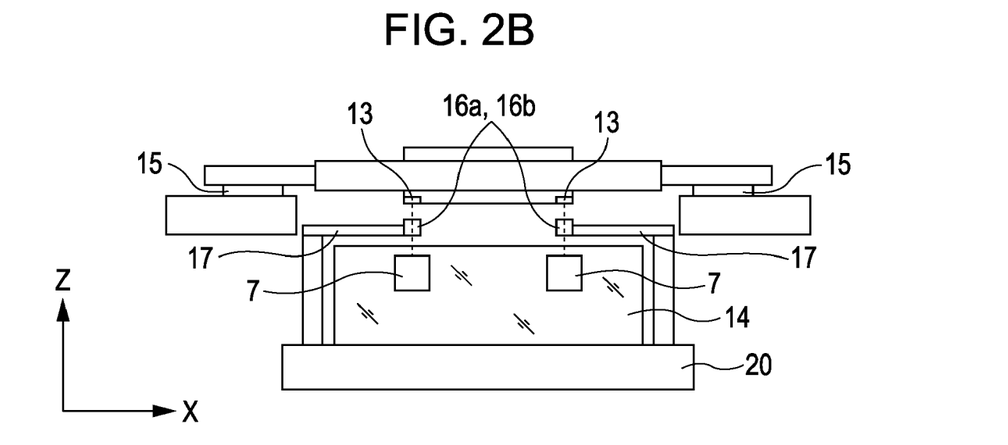
FIG. 2B is an external side view of the reticle stage as viewed in a moving direction along one of its axes (Y-axis).
Figure 3:
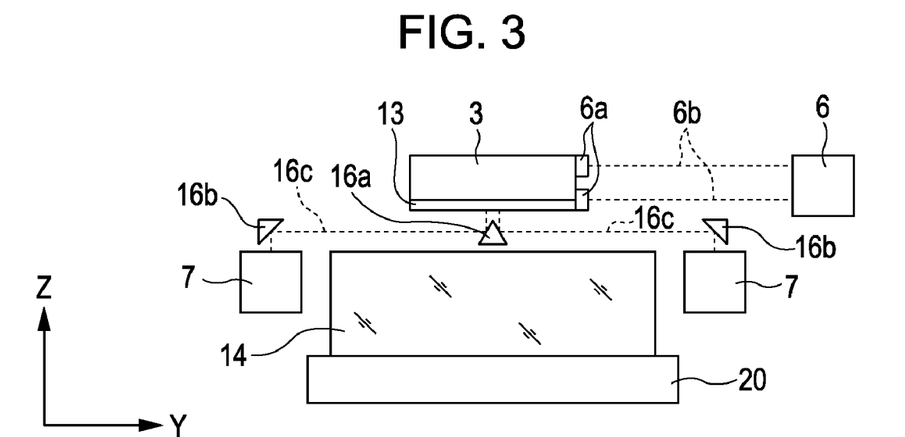
FIG. 3 is a side view showing a relevant part of the reticle stage shown in FIG. 2A, as viewed in an X-axis direction.

FIGS. 2A, 2B, and 3 illustrate the reticle stage 102 shown in FIG. 1. The reticle stage 102 has a fine-motion stage 3 (stage) that moves while holding thereon the reticle serving as an original.

The apparatus has Z-axis interferometers 7 (first interferometer) that emit measurement light beams 16c (first measurement light) used for measuring the position of the fine-motion stage 3.

The apparatus also has fine-motion Z-axis mirrors 13 (first mirror) provided on the bottom surface of the fine-motion stage 3 and reflecting mirrors 16a (second mirror) provided directly below the fine-motion Z-axis mirrors 13.

The reflecting mirrors 16a guide the measurement light beams 16c emitted from the Z-axis interferometers 7 toward the fine-motion Z-axis mirrors 13.

The measurement light beams 16c reflected by the fine-motion Z-axis mirrors 13 are returned to the Z-axis interferometers 7 via the reflecting mirrors 16a, whereby the position of the fine-motion stage 3 can be measured. As shown in the drawings, reflecting mirrors 16b may be disposed between the reflecting mirrors 16a and the Z-axis interferometers 7.

The Z-axis interferometers 7 are provided in pairs. The Z-axis interferometers 7 of each pair are disposed symmetrically with respect to the corresponding one of the reflecting mirrors 16a.

The measurement light beams 16c emitted from the Z-axis interferometers 7 are reflected by the fine-motion Z-axis mirrors 13.

The apparatus has fine-motion Y-axis/pitching interferometers 6 (second interferometer) serving as interferometers that emit a plurality of measurement light beams 6b (second measurement light) used for measuring the position of the fine-motion stage 3.

The apparatus also has reflecting mirrors 6a (third mirror) that are disposed on a side surface of the fine-motion stage 3.

The reflecting mirrors 6a reflect the plurality of measurement light beams 6b emitted from the fine-motion Y-axis/pitching interferometers 6 so as to guide the measurement light beams 6b toward the fine-motion Y-axis/pitching interferometers 6.

Thus, the position of the fine-motion stage 3 in the Y-axis direction can be measured. Based on this measurement result, the fine-motion stage 3 can be controlled in the pitching direction.

The Z-axis interferometers 7, the fine-motion Y-axis/pitching interferometers 6, the reflecting mirrors 16a, and the reflecting mirrors 6a are fixed to a stationary portion 20 that is supported independently of the fine-motion stage 3.

The reticle stage 102 including the above-described elements of the invention will be described in detail with reference to FIGS. 2A, 2B, and 3.

Although the wafer stage 104 can include the above-described elements of the invention, the wafer stage 104 will not be described here.

FIG. 2A is a top view of the reticle stage 102 including the above-described elements of the invention. FIG. 2B is an external side view of the reticle stage 102, as viewed in the moving direction along one of its axes (Y-axis).

The fine-motion stage 3 has linear motors 4, each including a coarse-motion linear-motor stator 1 and a coarse-motion linear-motor movable member 2. The linear motors 4 are provided on the opposite sides of the fine-motion stage 3.

The coarse-motion linear-motor stators 1 include armatures or permanent magnets arranged in the form of flat plates.

The coarse-motion linear-motor movable members 2 include plate-shaped armatures or permanent magnets and are provided on the opposite sides of a coarse-motion stage 5. When the stators 1 are provided with armatures, the movable members 2 are provided with permanent magnets, whereas when the stators 1 are provided with permanent magnets, the movable members 2 are provided with armatures. The coarse-motion linear-motor movable members 2 are provided so as to face the corresponding coarse-motion linear-motor stators 1.

The fine-motion stage 3 is disposed above the coarse-motion stage 5 and holds the reticle. As the coarse-motion stage 5 moves by a large distance in the scanning direction of the reticle, the fine-motion stage 3 is moved finely by the linear motors 4. In this manner, fine positioning of the reticle is performed.

The coarse-motion stage 5 moves together with the coarse-motion linear-motor movable members 2 in the scanning direction of the reticle, which is the Y-axis direction.

The coarse-motion stage 5 transmits an acceleration force or a deceleration force to the fine-motion stage 3 in the Y-axis direction and supports the stators 1 included in the linear motors 4 of the fine-motion stage 3.

The coarse-motion stage 5 is provided with coarse-motion guides 15. As the coarse-motion guides 15, air bearings are generally used.

In order to measure the position of the fine-motion stage 3 in the Y-axis direction and the pitching direction, the fine-motion Y-axis/pitching interferometers 6 guide measurement light beams to targets (reflecting mirrors 6a) at the top panel of the fine-motion stage 3 and receive the reflected light beams.

The fine-motion Y-axis/pitching interferometers 6 receiving the measurement light beams reflected by the reflecting mirrors 6a can also measure a flatness error that the reflecting mirrors 6a may have.

The Z-axis interferometers 7 can measure a displacement of the fine-motion stage 3 in the Z-axis direction. By additionally providing an X-axis interferometer (not shown), six-axis measurement of the fine-motion stage 3 can be implemented.

The fine-motion Y-axis/pitching interferometers 6 and the Z-axis interferometers 7 are supported by members linked with the stationary portion 20 which is where an exposure lens 14 is fixed.

These interferometers 6 and 7 may alternatively be supported by a reference base that supports the exposure lens 14.

Referring to FIG. 2B, the Z-axis interferometers 7 are supported by mirror supporting members 17 on the stationary portion 20. The mirror supporting members 17 are disposed outside the periphery of the exposure lens 14. This will be described hereinafter.

Coarse-motion interferometers 8 are interferometers that can measure the position of the coarse-motion stage 5 in the Y-axis direction. In this case, since the driving accuracy for the coarse-motion stage 5 can generally be lower than that for the fine-motion stage 3, a measuring unit other than an interferometer may be used as an alternative.

A self-weight compensation unit 9 has a suspension mechanism that can support the weight of the fine-motion stage 3 without relying on the linear motors 4. In detail, the self-weight compensation unit 9 may be of a type that uses a repulsive force of a magnet or of a type that uses an air spring.

I-shaped cores 10 constituted by magnetic bodies are disposed at edges of the fine-motion stage 3 in the Y-axis direction. E-shaped cores 11 constituted by magnetic bodies are disposed on the coarse-motion stage 5 at positions facing the corresponding I-shaped cores 10.

Joint coils 12 are provided around the corresponding E-shaped cores 11. By applying electricity to each joint coil 12, an electromagnetic force is generated between the corresponding I-shaped core 10 and E-shaped core 11. This electromagnetic force produces an attraction force between the I-shaped core 10 and the E-shaped core 11 in a non-contact state.

By producing an attraction force between the electromagnets in synchronization with the acceleration or deceleration of the coarse-motion stage 5, the acceleration or deceleration force can be transmitted from the coarse-motion stage 5 to the fine-motion stage 3.

The reflecting mirrors 16a and 16b are provided below the corresponding fine-motion Z-axis mirrors 13 to serve as reflecting mirrors for guiding the measurement light beams from the Z-axis interferometers 7 to the fine-motion Z-axis mirrors 13. For example, the reflecting mirrors 16a and 16b are disposed such that their Y-axis-direction positions are aligned with the axial lines of the corresponding fine-motion Z-axis mirrors 13.

The Z-axis interferometers 7 are provided at four locations that are free of the exposure lens 14. The incidence positions of the measurement light beams emitted upward from the Z-axis interferometers 7 coincide, in the Y-axis direction, with the axial lines of the corresponding fine-motion Z-axis mirrors 13 at the bottom surface of the fine-motion stage 3.

FIG. 3 is a side view showing a relevant part of the reticle stage 102 shown in FIG. 2A, as viewed in the X-axis direction.

The fine-motion Z-axis mirrors 13, the reflecting mirrors 16a, and the reflecting mirrors 16b will now be described in detail with reference to FIG. 3.

Each fine-motion Z-axis mirror 13 is a bar-like mirror that serves as a measurement target of the corresponding Z-axis interferometers 7 and extends longitudinally in the scanning direction (Y-axis direction). The fine-motion Z-axis mirrors 13 are provided on the bottom surface of the fine-motion stage 3 along opposite edges thereof.

The reflecting mirrors 16a are triangular mirrors that are supported by the mirror supporting members 17 above the stationary portion 20. Each of the reflecting mirrors 16a is fixed directly below the corresponding fine-motion Z-axis mirror 13 in the Z-axis direction.

Each of the reflecting mirrors 16b is supported by and fixed to the corresponding mirror supporting member 17 on the stationary portion 20 at a position directly above the corresponding Z-axis interferometer 7 in the Z-axis direction.

Each pair of reflecting mirrors 16b and the corresponding reflecting mirror 16a disposed at an intermediate position therebetween are set at the same height and guide the measurement light beams 16c from the corresponding Z-axis interferometers 7 toward the corresponding fine-motion Z-axis mirror 13.

Specifically, each pair of Z-axis interferometers 7 is disposed symmetrically with respect to the corresponding reflecting mirror 16a, and likewise, each pair of reflecting mirrors 16b is disposed symmetrically with respect to the corresponding reflecting mirror 16a. Moreover, the Z-axis interferometers 7 and the reflecting mirrors 16b are disposed in a space between the fine-motion stage 3 and the exposure lens 14. In addition, the Z-axis interferometers 7 are all set at the same height, and similarly, the reflecting mirrors 16b are all set at the same height. With such a configuration, the measurement light beams 16c from the Z-axis interferometers 7 can be guided to the fine-motion Z-axis mirrors 13.

The reflecting mirrors 16b reflect the measurement light beams 16c from the Z-axis interferometers 7 in the horizontal direction toward the reflecting mirrors 16a. The reflecting mirrors 16a reflect the measurement light beams 16c upward by 90° so as to allow the measurement light beams 16c to enter the fine-motion Z-axis mirrors 13.

As shown in FIG. 3, the reflected light beams from the fine-motion Z-axis mirrors 13 are reflected by the reflecting mirrors 16a and 16b so as to return to the Z-axis interferometers 7.

The reflecting mirrors 16a and 16b also constitute pitching interferometers that are capable of performing measurement in the pitching direction.

Thus, a detailed shape of the mirror surfaces of the fine-motion Z-axis mirrors 13 can be measured with the Z-axis interferometers 7 of a biaxial type while the fine-motion stage 3 is controlled in the pitching direction.

Based on the measurement result indicating the detailed shape of the mirror surfaces of the fine-motion Z-axis mirrors 13 obtained with the Z-axis interferometers 7, measurement errors that can occur depending on the flatness of the fine-motion Z-axis mirrors 13 can be reduced, whereby the fine-motion stage 3 can be driven while performing error correction at the same time.

In the related art, because the interferometers cannot be disposed in the space occupied by the reflecting mirrors 16a and 16b, the Z-axis mirrors 13 on the top panel of the fine-motion stage 3 need to be dimensionally increased in the X-axis direction.

In contrast, since the reflecting mirrors 16a and 16b are compact in the present invention, they can be disposed between the top panel of the fine-motion stage 3 and the exposure lens 14. This eliminates the need for dimensionally increasing the Z-axis mirrors 13 on the top panel of the fine-motion stage 3 in the X-axis direction.

Accordingly, this reduces the effect the mechanism that measures the position of the reticle stage 102 in the Z-axis direction has on the peripheral mechanisms, and achieves less weight and higher controllability.

Second Embodiment

Figure 4:
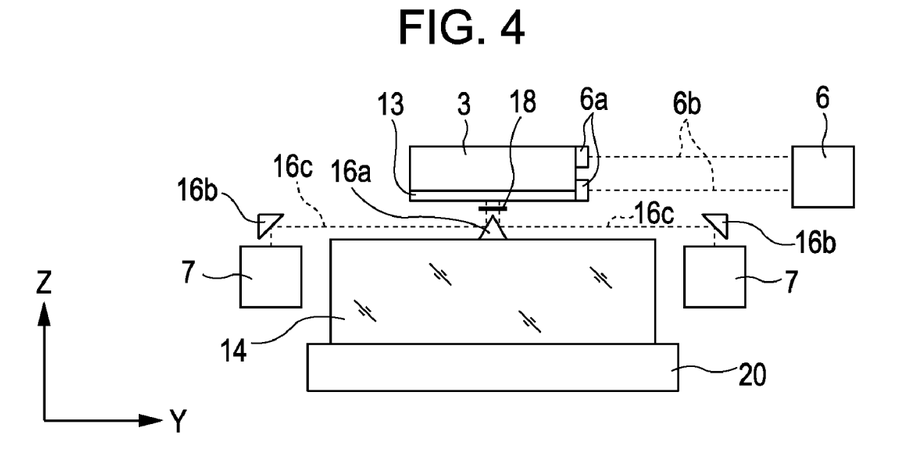
FIG. 4 is a side view showing a relevant part of a reticle stage included in an exposure apparatus according to a second embodiment of the invention, as viewed in the X-axis direction.

FIG. 4 is a side view showing a relevant part of a reticle stage 102 included in an exposure apparatus according to a second embodiment of the invention, as viewed in the X-axis direction. Reference numerals in FIG. 4 that are the same as those in FIGS. 1, 2A, and 2B indicate the same elements.

The exposure apparatus according to the second embodiment of the invention has reference mirrors 18 that do not allow transmission of reference light emitted from the Z-axis interferometers 7 (first interferometer). In other words, the reference mirrors 18 only reflect the reference light.

Each reference mirror 18 is supported by a supporter at a position on the light path of measurement light 16c between the corresponding fine-motion Z-axis mirror 13 (first mirror) and reflecting mirror 16a (second mirror).

In addition to measurement light 16c, the Z-axis interferometers 7 emit reference light (not shown) simultaneously in the same direction.

The measurement light 16c and the reference light emitted from the Z-axis interferometers 7 travel along the same path to an intermediate position, and proceed while changing their angles via the reflecting mirrors 16a and 16b.

Upon reaching the reference mirrors 18, the reference light returns to the Z-axis interferometers 7, but the measurement light 16c proceeds to the fine-motion Z-axis mirrors 13 on the fine-motion stage 3 where the measurement light 16c is reflected and directed back towards the Z-axis interferometers 7.

The Z-axis interferometers 7 generate an interference signal in accordance with the interference of the reference light and the measurement light 16c within the Z-axis interferometers 7 so that the Z-axis interferometers 7 are capable of measuring exclusively the amount of displacement between the reference mirrors 18 and the fine-motion stage 3.

In the first embodiment shown in FIG. 3, only the measurement light 16c is emitted, and the entire path of the measurement light 16c emitted from each Z-axis interferometer 7 is used as a basis for measuring the displacement. This can possibly have an effect on the mounting accuracy of the reflecting mirrors 16a and 16b.

In contrast, in the second embodiment, the intermediate path is not used as a basis for displacement measurement due to the reference mirrors 18. This prevents temperature fluctuation or error components caused by vibration of the reflecting mirrors 16a and 16b, thereby further enhancing the measurement accuracy.

The reflecting mirrors 16a and 16b and the reference mirrors 18 can be supported above the exposure lens 14 or by a measurement reference member other than the exposure lens 14.

Device-Manufacturing Method

An embodiment of a device-manufacturing method performed by using the above-described exposure apparatus will now be described with reference to FIGS. 5 and 6.

Figure 5:
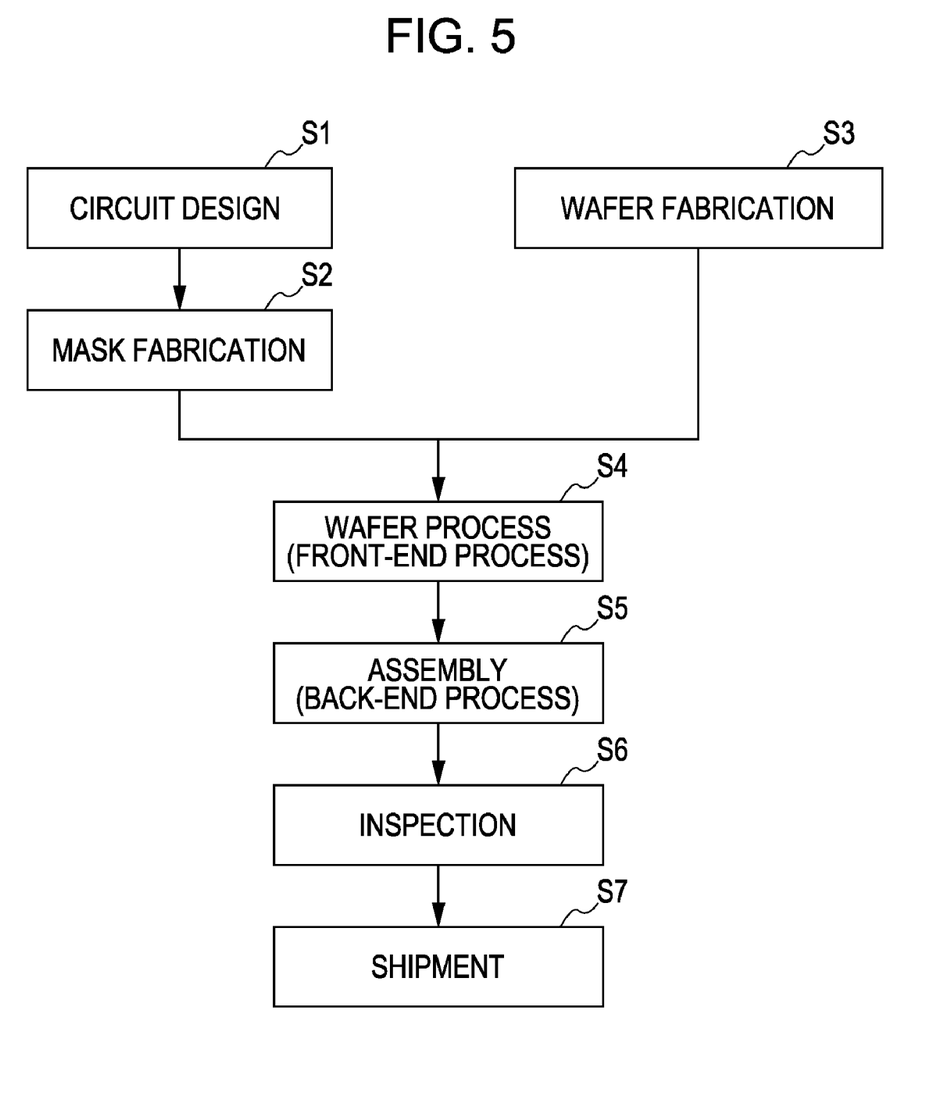
FIG. 5 is a flow chart of a device-manufacturing method that is performed using the exposure apparatus according to one of the above embodiments of the invention.

FIG. 5 is a flow chart illustrating a manufacturing method of devices (for example, semiconductor chips such as ICs and LSIs, LCDs, and CCDs). In this case, a manufacturing method of semiconductor chips will be described below as an example. Specifically, step S1 is a circuit design step for designing a circuit pattern of semiconductor chips.

Step S2 is a mask fabrication step for fabricating a mask on the basis of the designed circuit pattern. Alternatively, a reticle may be fabricated in this step.

Step S3 is a wafer fabrication step for fabricating a wafer using a material such as silicon.

Step S4 is a wafer process step, which is referred to as a front-end process. In this step, the above-described exposure apparatus is used to form actual circuits on the wafer by lithography using the mask and the wafer.

Step S5 is an assembly step, which is referred to as a back-end process. In this step, semiconductor chips are formed from the wafer obtained in step S4.

Specifically, this step S5 includes an assembly process (dicing and bonding) and a packaging process (chip sealing).

Step S6 is an inspection step for testing the semiconductor chips obtained in step S5 for, for example, operation and durability.

The semiconductor chips are thus completed through the above steps, and are subsequently shipped in step S7.

Figure 6:
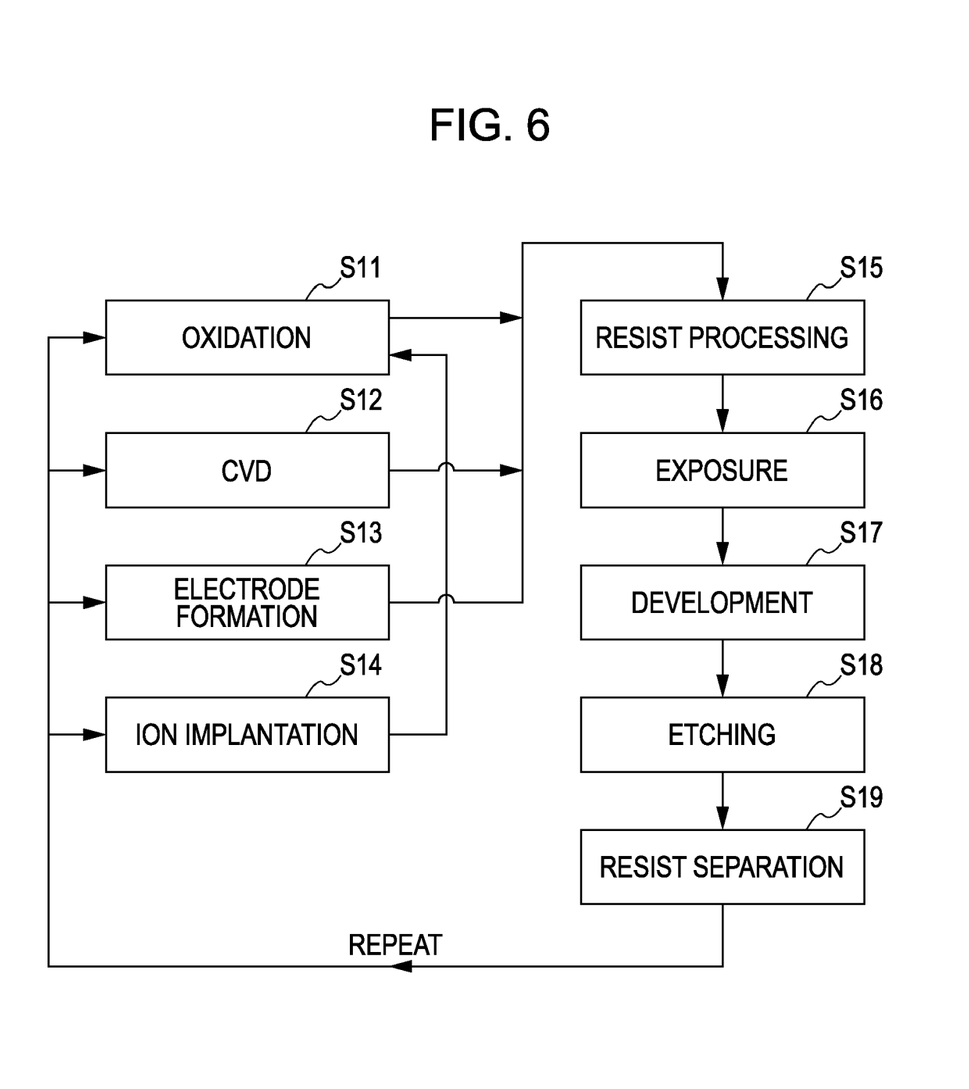
FIG. 6 is a detailed flow chart of a wafer process performed in step S4 of the flow chart shown in FIG. 5.

FIG. 6 is a detailed flow chart of the wafer process step performed in step S4.

Specifically, step S11 is an oxidation step where the surface of the wafer is oxidized.

Step S12 is a CVD step for forming an insulating film on the surface of the wafer.

Step S13 is an electrode formation step for forming electrodes on the wafer.

Step S14 is an ion implantation step for implanting ions into the wafer.

Step S15 is a resist processing step for applying a photosensitive agent onto the wafer.

Step S16 is an exposure step for projecting the circuit pattern of the mask onto the wafer by exposure using the above-described exposure apparatus.

Step S17 is a development step where the exposed wafer is developed.

Step S18 is an etching step for etching away parts other than the developed resist image.

Step S19 is a resist removal step for removing the resist that has become unnecessary after the etching step.

By repeating these steps, a multilayer circuit pattern is formed on the wafer.

Since the above-described exposure apparatus is used in this device-manufacturing method, the controllability of the exposure process is high, thereby improving the productivity of highly reliable devices.

According to the above embodiments of the invention, the effect that the mechanism for measuring the position of the stage in the Z-axis direction (i.e. the direction orthogonal to the bottom surface thereof) has on the peripheral mechanism can be reduced.

As a result, the stage can be reduced in width so that the apparatus can be reduced in weight accordingly. In addition, the space below the stage can be used efficiently, thereby enhancing the controllability of the stage.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-332688 filed Dec. 8, 2006, which is hereby incorporated by reference herein in its entirety.

What is claimed is:

1. An exposure apparatus comprising:
   a stage configured to hold an original thereon and to move in a horizontal direction;
   a first interferometer configured to emit first measurement light used for measuring a position of the stage in a vertical direction thereof;
   a first mirror provided on a bottom surface of the stage; and
   a second mirror provided directly below the first mirror,
   wherein the second mirror is disposed so as to guide the first measurement light emitted from the first interferometer to the first mirror, and
   wherein the first interferometer comprises a pair of first interferometers disposed at opposite sides of the second mirror.

2. The exposure apparatus according to claim 1, further comprising:
   a second interferometer configured to emit second measurement light used for measuring a position of the stage in the horizontal direction and a pitching direction; and
   a third mirror provided on a side surface of the stage.

3. The exposure apparatus according to claim 1, further comprising a reference mirror disposed between the first mirror and the second mirror,
   wherein the first measurement light includes reference light and measurement light, and
   wherein the reference mirror is configured to reflect the reference light.

* * * * *